(12) United States Patent
Tang (10) Patent No.: US 11,309,395 B2
(45) Date of Patent: Apr. 19, 2022

(54) 1.5T SONOS MEMORY STRUCTURE AND MANUFACTURING METHOD

(71) Applicant: Shanghai Huali Microelectronics Corporation, Shanghai (CN)

(72) Inventor: Xiaoliang Tang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 52 days.

(21) Appl. No.: 16/826,554

(22) Filed: Mar. 23, 2020

(65) Prior Publication Data

US 2021/0143259 A1     May 13, 2021

(30) Foreign Application Priority Data

Nov. 12, 2019    (CN) .......................... 201911100281.7

(51) Int. Cl.
| | |
|---|---|
| *H01L 29/423* | (2006.01) |
| *H01L 21/28* | (2006.01) |
| *H01L 29/66* | (2006.01) |
| *H01L 29/792* | (2006.01) |

(52) U.S. Cl.
CPC .. *H01L 29/42344* (2013.01); *H01L 29/40117* (2019.08); *H01L 29/665* (2013.01); *H01L 29/66833* (2013.01); *H01L 29/792* (2013.01)

(58) Field of Classification Search
CPC ......... H01L 29/42344; H01L 29/40117; H01L 29/665; H01L 29/66833; H01L 29/792; H01L 27/11568; H01L 27/11524; H01L 27/1157; H01L 27/115–11597; H01L 29/42324–42336; H01L 29/788–7889; G11C 16/04–0491; G11C 2216/06–10
See application file for complete search history.

(56) References Cited

U.S. PATENT DOCUMENTS

| | | | | | |
|---|---|---|---|---|---|
| 5,455,792 | A | * | 10/1995 | Yi ..................... | H01L 29/42328 |
| | | | | | 257/316 |
| 2006/0234454 | A1* | | 10/2006 | Yasui ................ | H01L 29/66833 |
| | | | | | 438/267 |
| 2018/0182631 | A1* | | 6/2018 | Kumagae ........... | H01L 27/1157 |

FOREIGN PATENT DOCUMENTS

| | | | | | |
|---|---|---|---|---|---|
| CN | 108172581 | A | * | 6/2018 | ....... H01L 29/42344 |
| EP | 3291292 | A1 | * | 3/2018 | ........... H01L 29/792 |

* cited by examiner

*Primary Examiner* — Shahed Ahmed
(74) *Attorney, Agent, or Firm* — Banner & Witcoff, Ltd.

(57) ABSTRACT

The present invention provides a 1.5T SONOS memory structure and a manufacturing method, comprises a P-well and a storage well on its side, gates of a select transistor and a storage transistor; the height of the select transistor gate is less than the height of the storage transistor gate, an stack layer is between the gats of the select transistor and the storage transistor which height is same as the storage transistor gate; the top of the select transistor gate has a first sidewall; the sidewall of the select transistor gate has a second sidewall. The present invention strengthens the isolation between the gates of the select transistor and the storage transistor, reduces the risk of current leakage, enables the metal silicide to also grow on the gate of the select transistor, reduces the resistance of the select transistor and improves the performance of the device.

15 Claims, 10 Drawing Sheets

1.5T SONOS MEMORY STRUCTURE AND MANUFACTURING METHOD

CROSS REFERENCE TO RELATED APPLICATIONS

The present application claims priority to and the benefit of Chinese Patent Application No. 2019111002817 filed on Nov. 12, 2019, the disclosure of which is incorporated herein by reference in its entirety as part of the present application.

BACKGROUND

The present invention relates to the field of semiconductor integrated circuits, in particular to a 1.5T SONOS memory structure and a manufacturing method.

Figure 1:
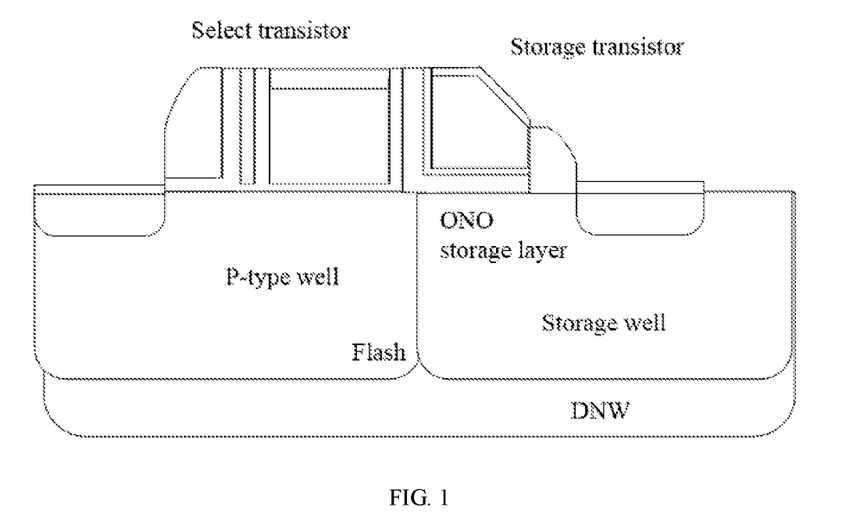
FIG. 1 illustrates a schematic view of a 1.5T SONOS structure in the prior art.
Figure 2:
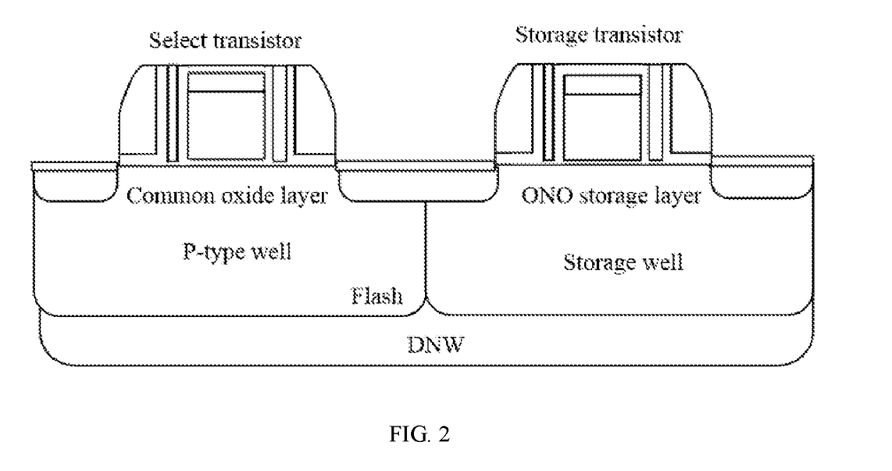
FIG. 2 illustrates a schematic view of a 2T SONOS structure in the prior art.
Figure 3A:
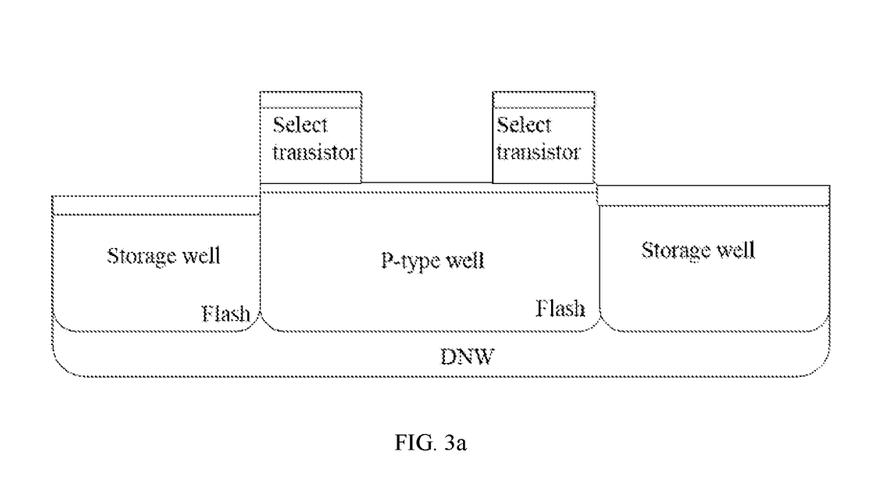
FIG. 3a to FIG. 3h illustrate schematic views of structures at each link in a process for manufacturing a 1.5T SONOS structure in the prior art.
Figure 3B:
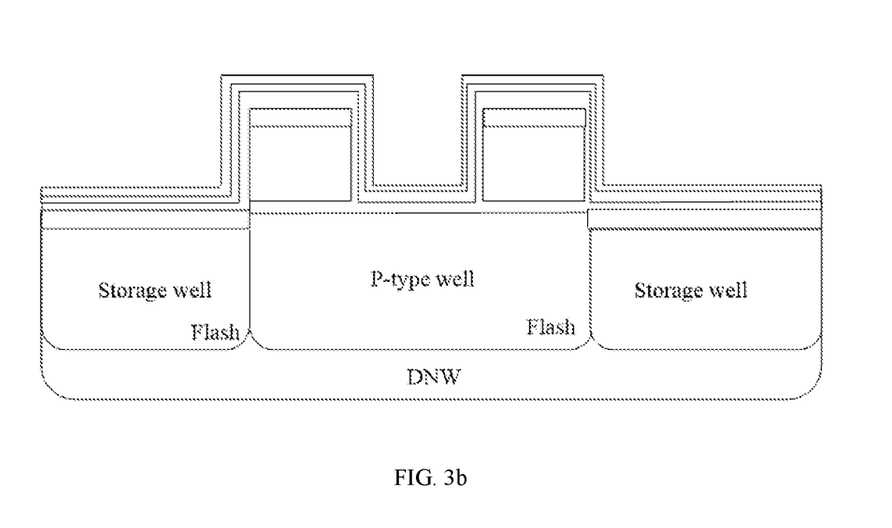
Figure 3C:
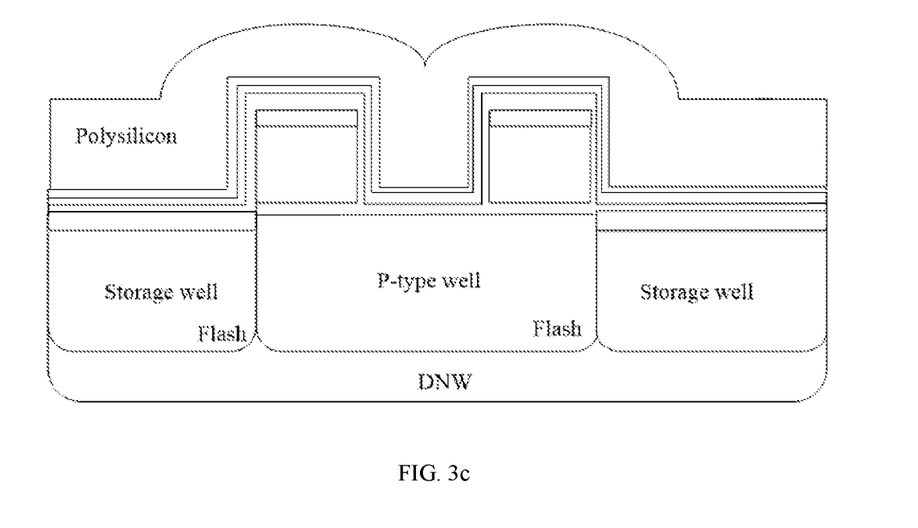
Figure 3D:
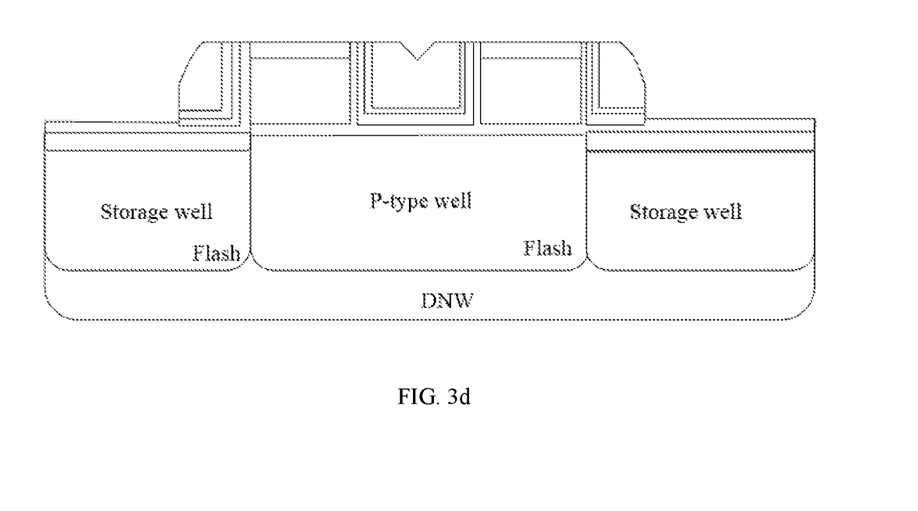
Figure 3E:
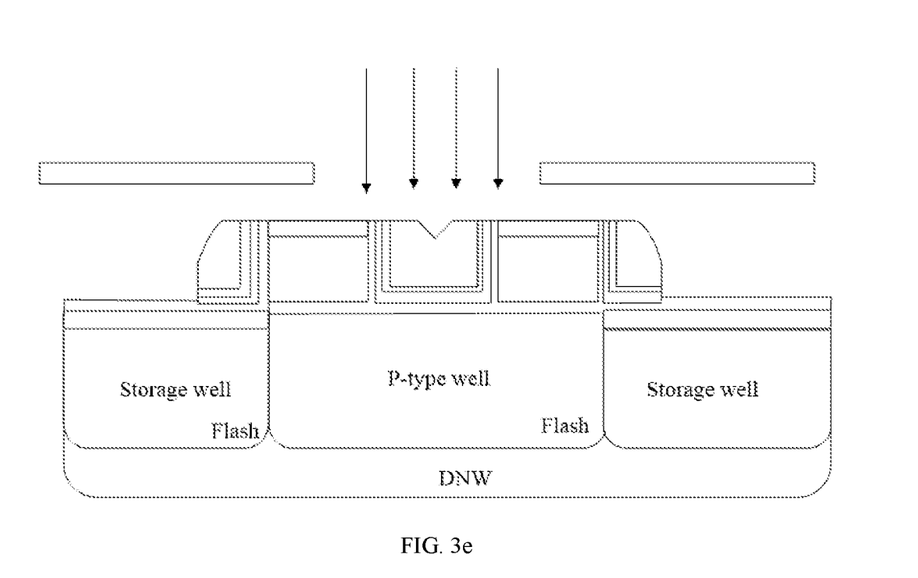
Figure 3F:
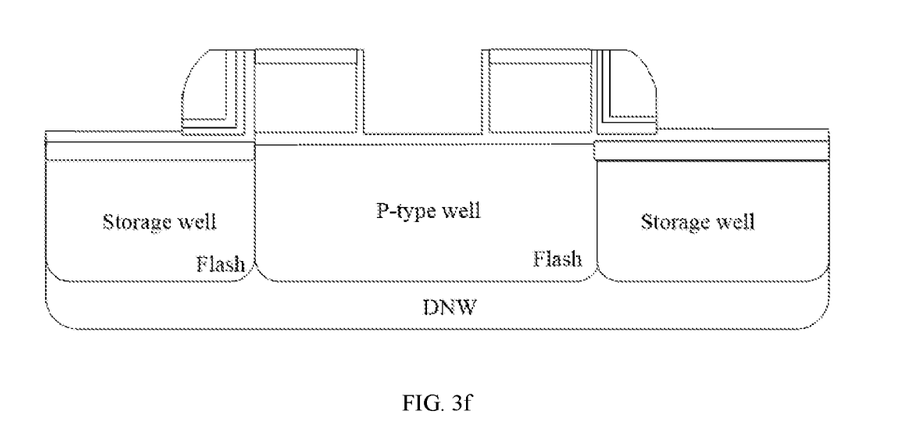
Figure 3G:
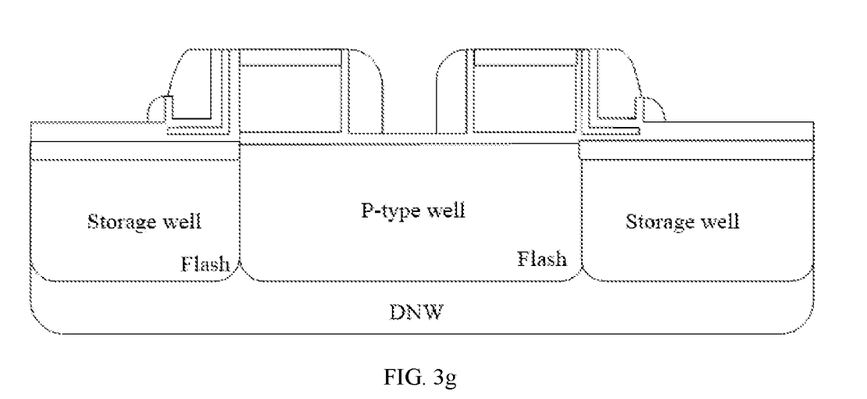
Figure 3H:
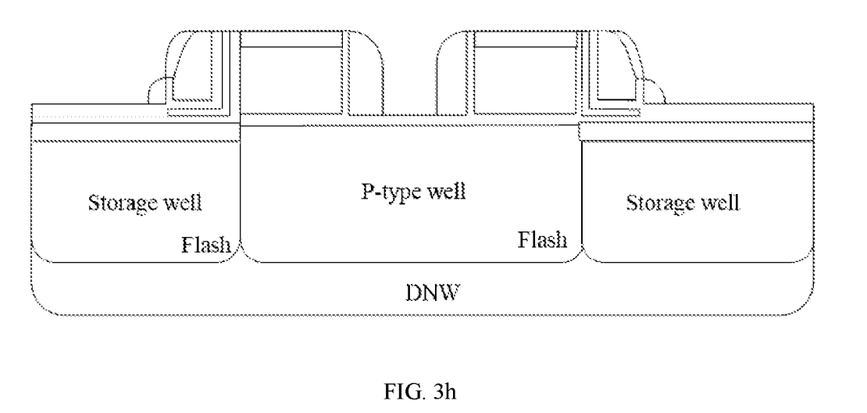
Figure 4:
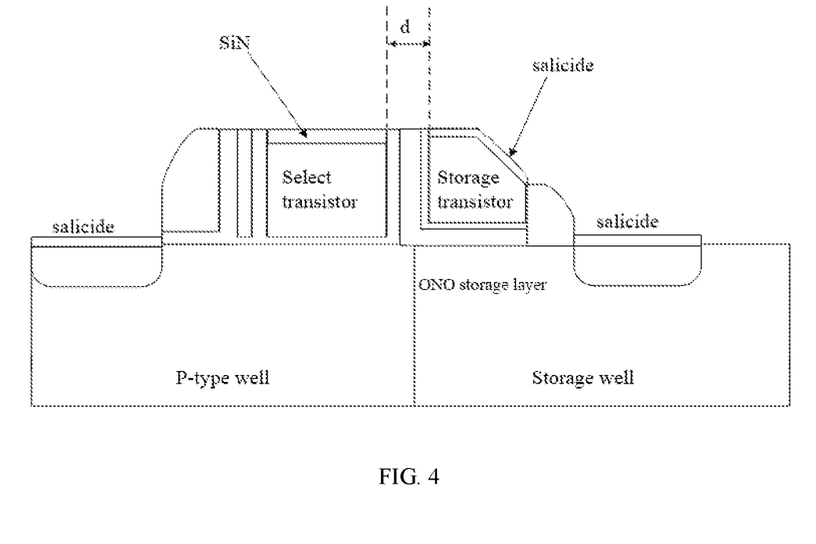
FIG. 4 illustrates a schematic view of a structure with current leakage or breakdown caused by short distance between a select transistor and a storage transistor in a 1.5T SONOS structure in the prior art.

The traditional 1.5T (translator) SONOS storage unit consists of two transistors that can be operated independently, including a select transistor and a storage transistor. The two transistors are provided close to each other, as illustrated in FIG. 1. As illustrated in FIG. 2, compared with a 2T SONOS structure, the area of the storage unit can be significantly reduced. The select transistor is mainly used for conduction and turning-off of the storage transistor to reduce current leakage. The storage transistor is mainly used for storing electric charges and realizing data storage through different Vt states. The formation process of the traditional 1.5T SONOS comprises firstly defining a gate of a select transistor (as illustrated in FIG. 3a), then depositing a storage ONO layer and storage transistor polysilicon (as illustrated in FIG. 3b and FIG. 3c), performing etching to remove excessive polysilicon (as illustrated in FIG. 3d), then performing photoetching to open an intermediate area of adjacent storage units (as illustrated in FIG. 3e), then performing etching to remove excessive polysilicon between the select transistors (as illustrated in FIG. 3f), then forming a side isolation wall (as illustrated in FIG. 3g), and subsequently forming salicide on the storage transistors through salicide (as illustrated in FIG. 3h). Generally, salicide is not grown on the gate of the select transistor, as illustrated in FIG. 4. This is mainly to avoid that, if the isolation of salicide is not well done, the distance between the select transistor and the storage transistor is short when the storage unit is operated, current leakage or even breakdown at the top is caused when different voltages are applied to the gates of the select transistor and the storage transistor, the connection resistance of the select transistor is caused to increase, and delay is caused when a very long select transistor is used in the circuit.

BRIEF SUMMARY

In view of the above disadvantages of the prior art, the purpose of the present invention is to provide a 1.5T SONOS memory structure and a manufacturing method, which are used for solving the problems that the connection resistance of the select transistor is increased and delay is caused since a very long select transistor is used in order to avoid current leakage in the prior art.

In order to realize the above purpose and other related purposes, the present invention provides a 1.5T SONOS memory structure. the structure at least comprises a P-type well and a storage well on one side of the P-type well; a select transistor gate on the P-type well; and a storage transistor gate on the storage well; the height of the select transistor gate is less than the height of the storage transistor gate, the sidewall of the storage transistor gate far away from the select transistor gate is a slope, and metal silicide is provided on the slope; an ONO stack layer is provided between the select transistor gate and the storage transistor gate, and the height of the ONO stack layer is the same as the height of the storage transistor gate; the top of the select transistor gate is provided with a first sidewall relying on the ONO stack layer; the rest part of the top of the select transistor gate is provided with metal silicide; the sidewall of the select transistor gate far away from the storage transistor gate is provided with a second sidewall.

Preferably, the P-type well and the storage well are located on a DNW.

Preferably, the upper surface of the storage well is provided with an implantation layer.

Preferably, the upper surfaces of the P-type well and the implantation layer are provided with an oxide layer.

Preferably, the ONO stack layer is further provided between the bottom surface of the storage transistor gate and the oxide layer.

Preferably, a third sidewall is provided on polysilicon between the lower end of the sloped sidewall of the storage transistor gate and the oxide layer.

The present invention provides a method for manufacturing a 1.5T SONOS memory structure. The method at least comprises the following steps: step 1: providing a P-type well and a storage well on one side of the P-type well, depositing a polysilicon layer on the P-type well and the storage well, depositing silicon nitride on the polysilicon layer, and then performing photoetching and etching to form a select transistor gate located on the P-type well and covered with a silicon nitride layer on the top; step 2: depositing an ONO stack layer on the P-type well, the select transistor gate and the storage well; step 3: depositing polysilicon on the ONO stack layer, performing etching until the silicon nitride layer on the top of the select transistor gate is exposed, and forming a storage transistor gate on the storage well, the sidewall of the storage transistor gate far away from the select transistor gate being a slope; step 4: performing photoetching to open adjacent storage units on the P-type well on the side of the select transistor gate far away from the storage transistor gate, removing the polysilicon on the adjacent storage units and the silicon oxide and silicon nitride layer on the outer layer of the ONO stack layer, and reserving a layer of silicon oxide on the sidewall of the select transistor gate and the adjacent storage units; step 5: removing the silicon nitride layer on the top of the select transistor gate, the height of the formed select transistor gate being less than the height of the storage transistor gate; step 6: sequentially performing deposition and etching to form a first sidewall relying on the ONO stack layer on the top of the select transistor gate and form a second sidewall on the sidewall of the select transistor gate far away from the storage transistor gate; step 7: forming metal silicide on the rest part of the top of the select transistor gate and the sloped sidewall of the storage transistor gate.

Preferably, in step 1, the thickness of the silicon nitride layer on the top of the select transistor gate formed after photoetching and etching is 500-600 angstroms.

Preferably, in step 5, the silicon nitride layer on the top of the select transistor is removed through acid pickling.

Preferably, in step 1, the P-type well and the storage well on one side of the P-type well are located on a DNW.

Preferably, in step 1, an oxide layer is provided above the DNW and below the P-type well and the storage well.

Preferably, in step 1, an implantation layer on the DNW is provided below the oxide layer on the storage well.

Preferably, in step 6, deposition and etching are sequentially performed to form a third sidewall on the polysilicon between the lower end of the sloped sidewall of the storage transistor and the oxide layer.

Preferably, in step 7, metal silicide is formed on the rest part of the top of the select transistor gate and the sloped sidewall of the storage transistor gate by adopting a self-alignment process.

Preferably, the first sidewall, the second sidewall and the third sidewall are silicon nitride.

As described above, the 1.5T SONOS memory structure and the manufacturing method provided by the present invention have the following beneficial effects: by improving the traditional 1.5T SONOS process, the present invention strengthens the isolation between the gates of the select transistor and the storage transistor, reduces the risk of current leakage of the select transistor gate and the storage transistor gate, enables the metal silicide to also grow on the gate of the select transistor, reduces the resistance of the select transistor and improves the performance of the device.

DETAILED DESCRIPTION

The embodiments of the present invention will be described below through specific examples. One skilled in the art can easily understand other advantages and effects of the present invention according to the contents disclosed in the description. The invention may also be implemented or applied by means of different specific embodiments. Various details in the description may also be modified or changed without departing from the spirit of the present invention based on different viewpoints and applications.

Figure 5A:
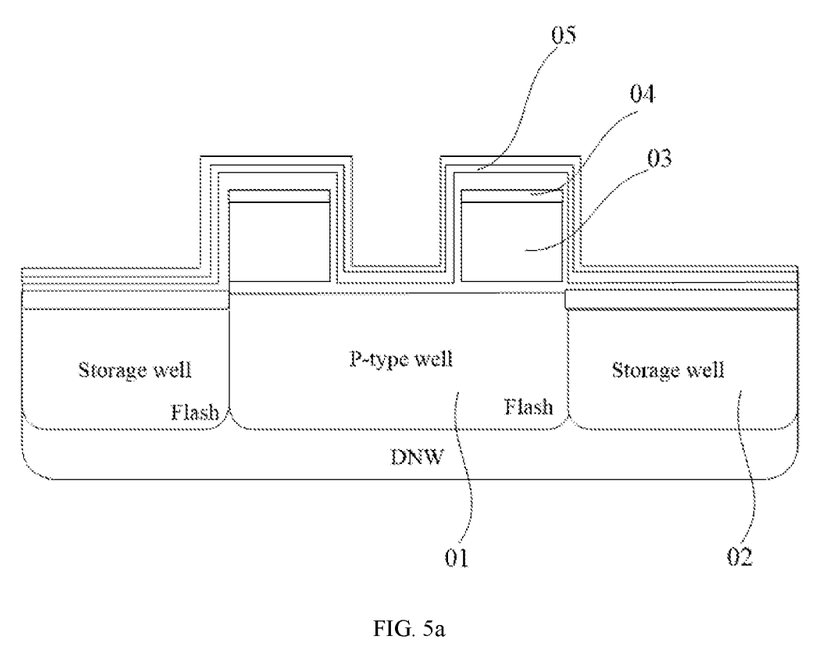
FIG. 5a to FIG. 5h illustrate schematic views of structures at each link in a process for manufacturing a 1.5T SONOS structure in the present invention.
Figure 5B:
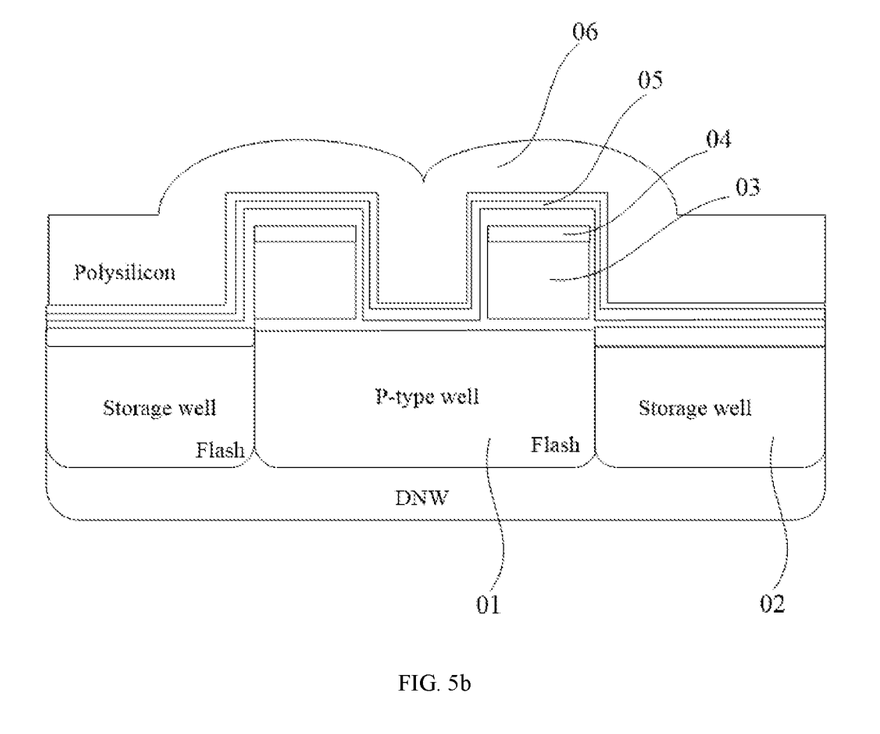
Figure 5C:
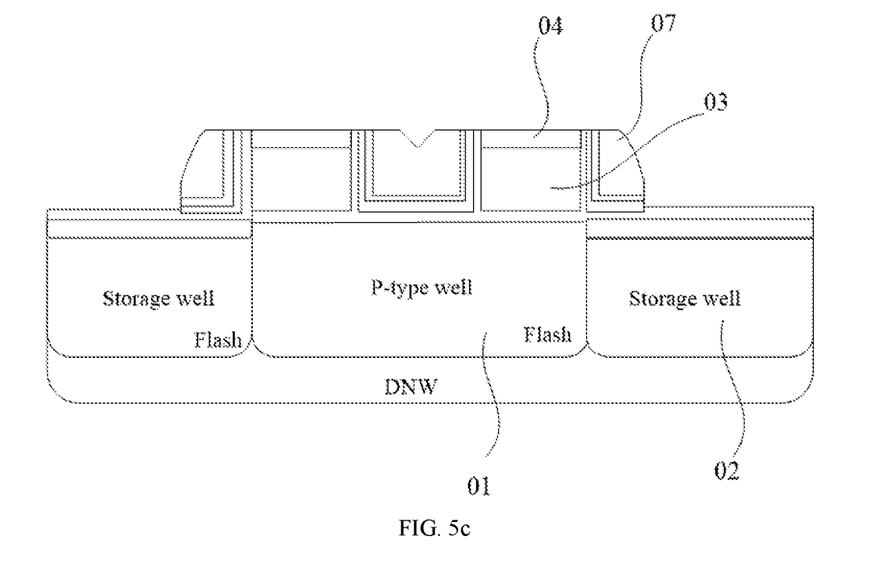
Figure 5D:
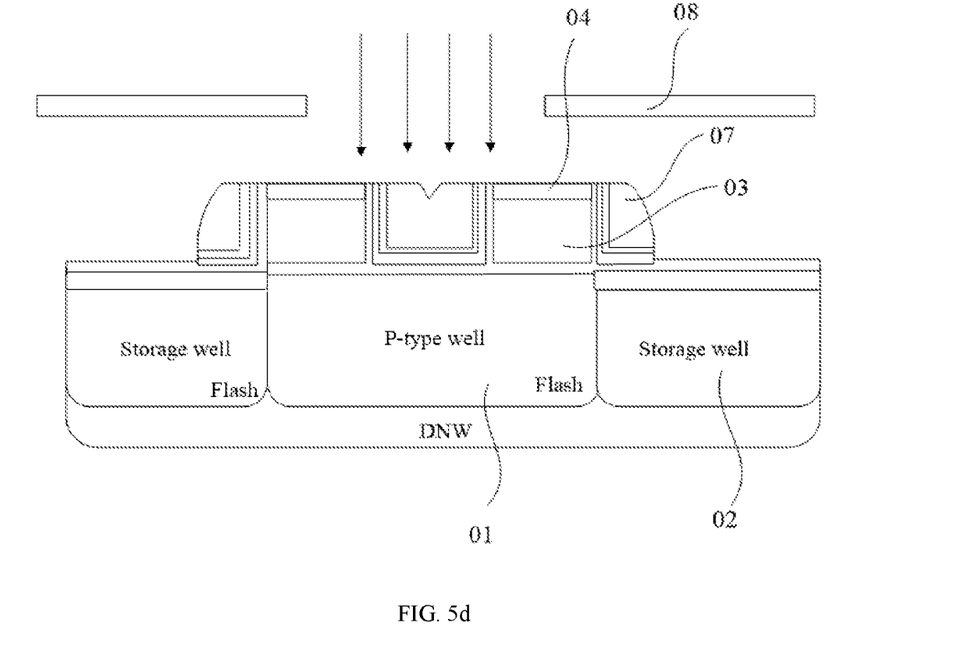
Figure 5E:
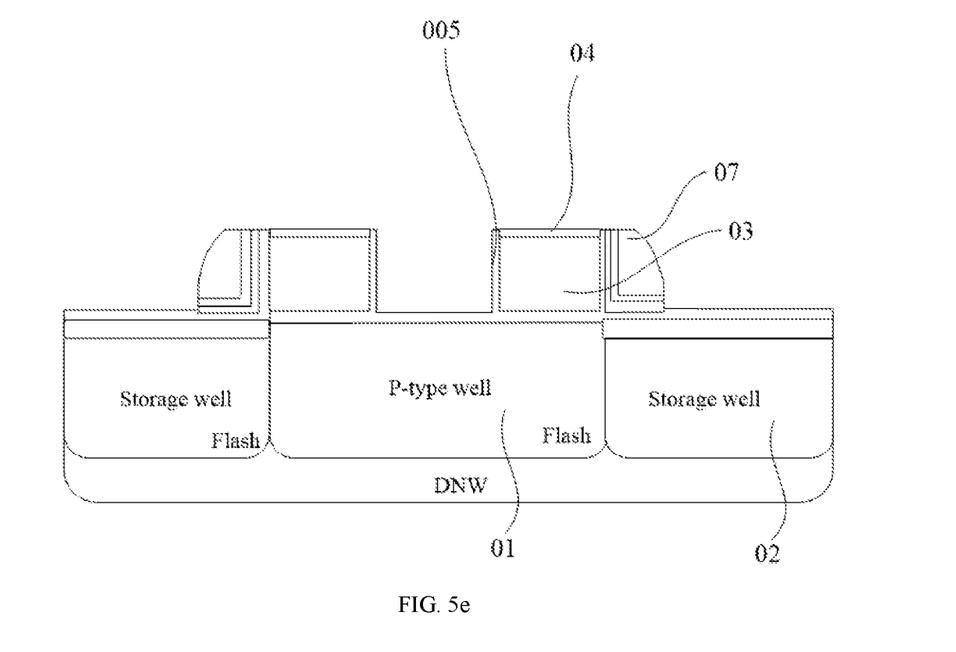
Figure 5F:
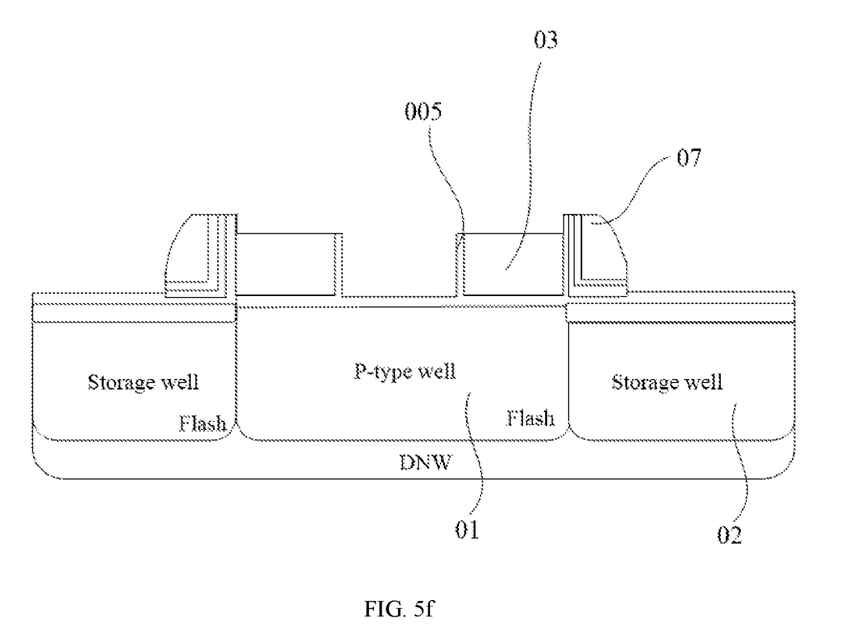
Figure 5G:
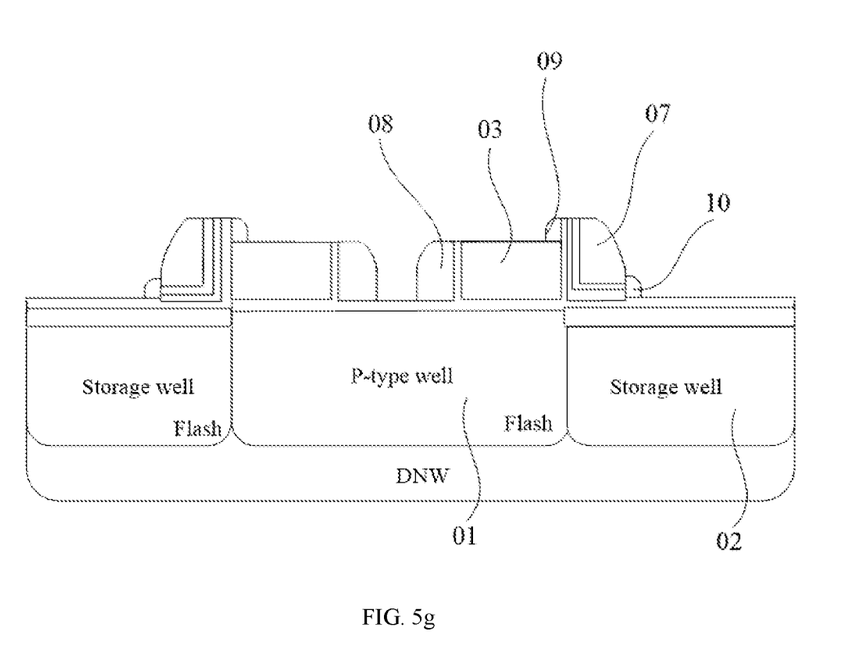
Figure 5H:
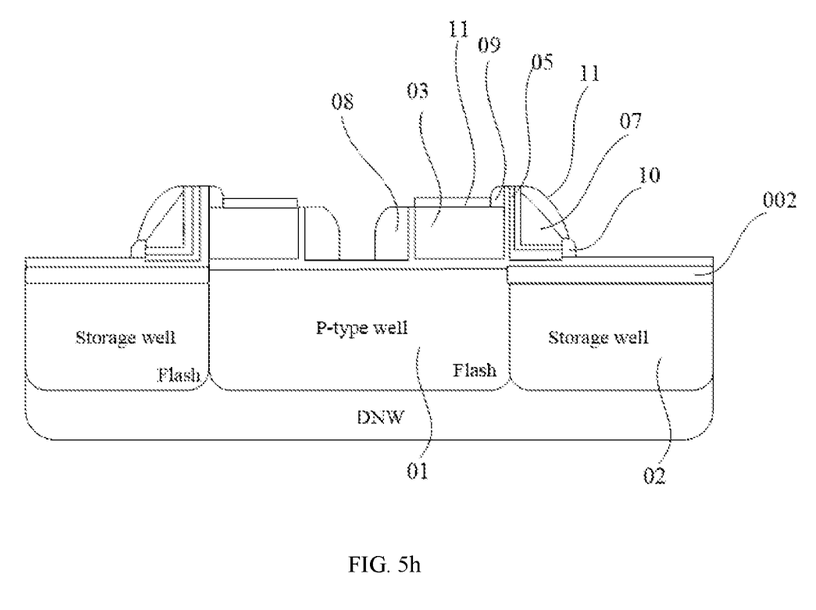

Please refer to FIG. 5 to FIG. 5h. It should be noted that the illustrations provided in the embodiment only schematically illustrate the basic concept of the present invention, so that the drawings only illustrate the components related to the present invention but are not drawn according to the number, shape and size of the components in the actual implementation. The configuration, number and scale of the components in the actual implementation may be changed freely, and the layout configuration of the components may be more complex.

The present invention provides a 1.5T SONOS memory structure. As illustrated in FIG. 5h, the structure at least comprises a P-type well 01 and a storage well 02 on one side of the P-type well 01. Further, in the present invention, the P-type well 01 and the storage well 02 are located on a DNW (Deep N-type Well). In other words, there are the P-type well 01 and the storage well 02 which are adjacent to each other on the DNW.

As illustrated in FIG. 5h, in the present invention, the upper surface of the storage well 02 is provided with an implantation layer 002. Further, in the present invention, the upper surfaces of the P-type well 01 and the implantation layer 002 are provided with an oxide layer. In other words, there is an oxide layer on the upper surface of the P-type well 01 and the upper surface of the implantation layer 002 on the storage well 02. In the embodiment, the oxide layer is silicon oxide.

The 1.5T SONOS memory structure provided by the present invention further comprises a select transistor gate 03 on the p-well 01, and a storage transistor gate 07 on the storage well 02; the select transistor gate 03 and the storage transistor gate 07 are formed by etching polysilicon. The height of the select transistor gate 03 is less than the height of the storage transistor gate 07, the sidewall of the storage transistor gate 07 far away from the select transistor gate 03 is a slope, and a metal silicide 11 is provided on the slope. In other words, since one sidewall of the storage transistor gate 07 is sloped, the height of the top end of the sloped sidewall is more than the height of the top of the select transistor gate 03. An ONO stack layer (silicon oxide-silicon nitride-silicon oxide stack layer) 05 is provided between the select transistor gate 03 and the storage transistor gate 07, and the height of the ONO stack layer is the same as the height of the storage transistor gate 07. In other words, the top of the ONO stack layer is in flush with the top of the sloped storage transistor gate 07.

The top of the select transistor gate 03 is provided with a first sidewall 09 relying on the ONO stack layer. As illustrated in FIG. 5h, since the height of the select transistor gate 03 is less than the height of top of the storage transistor gate 07, there is a first sidewall 09 relying on the ONO stack layer on one side of the top of the select transistor gate 03, as illustrated in FIG. 5h, and the ONO stack layer is exposed out of one side of the top of the select transistor gate 03.

The rest part of the top of the select transistor gate 03 is provided with metal silicide 11. That is to say, on the top of the select transistor gate 03, except the first sidewall 09, the rest part is covered by the metal silicide 11. The sidewall of the select transistor gate 03 far away from the storage transistor gate 07 is provided with a second sidewall 08. That is to say, one sidewall of the select transistor gate 03 is adjacent to the storage transistor gate 07 by relying on the ONO stack layer 05, the other sidewall of the select transistor gate 03 is farther away from the storage transistor gate 07, and the second sidewall 08 is provided on the sidewall. In the embodiment, there is also an oxide layer between the second sidewall 08 and the selector transistor gate 03.

Further, in the present invention, the ONO stack layer is further provided between the bottom surface of the storage transistor gate 07 and the oxide layer. Further, in the present invention, a third sidewall 10 is provided on the polysilicon between the lower end of the sloped sidewall of the storage transistor gate 07 and the oxide layer. In other words, the part between the lower end of the sloped sidewall of the storage transistor gate 07 and the oxide layer is a vertical part, the polysilicon is exposed out of this part, and the polysilicon at the part is covered by the third sidewall 10. Further, in the present invention, the first sidewall 09, the second sidewall 08 and the third sidewall 10 are all silicon nitride.

The present invention further provides a method for manufacturing a 1.5T SONOS memory structure. As illustrated in FIG. 5a to FIG. 5h, which illustrate schematic views of structures at each link in a process for manufacturing the 1.5T SONOS structure in the present invention, the method at least comprises the following steps:

In step 1, as illustrated in FIG. 5a, a P-type well 01 and a storage well 02 on one side of the P-type well 01 are provided, a polysilicon layer is deposited on the P-type well 01 and the storage well 02, silicon nitride is deposited on the polysilicon layer, and then photoetching and etching are performed to form a select transistor gate 03 located on the P-type well 01 and covered with a silicon nitride layer 04 on the top. Further, in the present invention, in step 1, the thickness of the silicon nitride layer 04 on the top of the select transistor gate 03 formed after photoetching and etching is 500-600 angstroms. Further, in the present invention, in step 1, the P-type well 01 and the storage well 02 on one side of the P-type well 01 are located on a DNW. In step 1, an oxide layer is provided above the DNW and below the P-type well 01 and the storage well 02. In step 1, an implantation layer on the DNW is provided below the oxide layer on the storage well 02.

In step 2, as illustrated in FIG. 5a and FIG. 5b, an ONO stack layer 05 is deposited on the P-type well 01, the select transistor gate 03 and the storage well 02. In the embodiment, an implantation layer and an oxide layer are provided on the storage well 02, so the deposited ONO stack layer 05 falls onto the oxide layer on the storage well.

In step 3, as illustrated in FIG. 5b, polysilicon 06 is deposited on the ONO stack layer 05 and etching is performed until the silicon nitride layer 04 on the top of the select transistor gate 03 is exposed (as illustrated in FIG. 5c), and a storage transistor gate 07 is formed on the storage well 02. The sidewall of the storage transistor gate 07 far away from the select transistor gate is a slope. In this step, the top height of the silicon nitride layer 04 on the top of the select transistor gate 03 formed by etching is the same as (in flush with) the top height of the formed storage transistor gate 07. In this step, polysilicon is also filled in the adjacent storage units (above the P-type well) on the left side of the select transistor.

In step 4, as illustrated in FIG. 5d and FIG. 5e, photoetching is performed to open adjacent storage units on the P-type well on the side of the select transistor gate 03 far away from the storage transistor gate 07, the polysilicon on the adjacent storage units and the silicon oxide and silicon nitride layer on the outer layer of the ONO stack layer is removed, and a layer of silicon oxide is reserved on the sidewall of the select transistor gate and the adjacent storage units. As illustrated in FIG. 5d, during etching, the storage units on the P-type well are exposed through a photomask 08, then etching is performed to remove the polysilicon in this area, the ONO stack layer is also stored in this area, the outer layer of the ONO stack layer is silicon oxide, the middle layer is silicon nitride, and the inner layer is silicon oxide. In this step, the silicon oxide on the outer layer and the silicon nitride on the middle layer in the ONO stack layer in this area are removed, and the silicon oxide 005 on the inner layer is reserved to form the structure illustrated in FIG. 5e.

In step 5, as illustrated in FIG. 5f, the silicon nitride layer on the top of the select transistor gate 03 is removed. The height of the formed select transistor gate 03 is less than the height of the storage transistor gate 07. Further, in the present invention, in step 5, the silicon nitride layer on the top of the select transistor is removed through acid pickling.

In step 6, as illustrated in FIG. 5g, deposition and etching are sequentially performed to form a first sidewall 09 relying on the ONO stack layer on the top of the select transistor gate and form a second sidewall 08 on the sidewall of the select transistor gate far away from the storage transistor gate. Further, in the present invention, in step 6, deposition and etching are sequentially performed to form a third sidewall 10 on the polysilicon between the lower end of the sloped sidewall of the storage transistor and the oxide layer. Since the height of the select transistor gate 03 is less than the height of the top of the storage transistor gate 07, there is a first sidewall 09 relying on the ONO stack layer on one side of the top of the select transistor gate 03. As illustrated in FIG. 5h, the ONO stack layer is exposed out of one side of the top of the select transistor gate 03. Further, in the present invention, the first sidewall, the second sidewall and the third sidewalls are silicon nitride.

In step 7, as illustrated in FIG. 5h, metal silicide 11 is formed on the rest part of the top of the select transistor gate 03 and the sloped sidewall of the storage transistor gate. Since the first sidewall 09 relying on the ONO stack layer is provided on one side of the top of the select transistor gate, the rest part of the top of the select transistor gate 03 is covered by the metal silicide 11 except the part occupied by the first sidewall. Further, in the present invention, in step 7, metal silicide is formed on the rest part of the top of the select transistor gate and the sloped sidewall of the storage transistor gate by adopting a self-alignment process.

Therefore, the distance between the select transistor and the storage transistor of the present invention is long. Even if there is metal silicide on the two sides, no breakdown occurs.

To sum up, by improving the traditional 1.5T SONOS process, the present invention strengthens the isolation between the gates of the select transistor and the storage transistor, reduces the risk of current leakage of the select transistor gate and the storage transistor gate, enables the metal silicide to also grow on the gate of the select transistor, reduces the resistance of the select transistor and improves the performance of the device. Therefore, the present invention overcomes various disadvantages in the prior art and thus has a great industrial utilization value.

The above embodiments are just used for exemplarily describing the principle and effect of the present invention, instead of limiting the present invention. Any one skilled in the art may modify or change the above embodiments without departing from the spirit and scope of the present invention. Therefore, all equivalent modifications or changes made by one skilled in the art without departing from the spirit and technical thought disclosed in the present invention shall still be covered by the claims of the present invention.

What is claimed is:
1. A 1.5T SONOS memory structure, comprising:
   a P-type well and a storage well on one side of the P-type well;
   a select transistor gate on the P-type well; and
   a storage transistor gate on the storage well, wherein a height of the select transistor gate is less than a height of the storage transistor gate, a sidewall of the storage transistor gate farthest from the select transistor gate is a slope, and a first metal silicide is provided on the slope; an ONO stack layer is provided between the select transistor gate and the storage transistor gate, and a height of the ONO stack layer is the same as the height of the storage transistor gate;
   a top of the select transistor gate is provided with a first sidewall relying on the ONO stack layer; a remaining part of the top of the select transistor gate is provided with a second metal silicide; and a sidewall of the select transistor gate farthest from the storage transistor gate is provided with a second sidewall.

2. The 1.5T SONOS memory structure according to claim 1, wherein the P-type well and the storage well are located on a Deep N-type Well (DNW).

3. The 1.5T SONOS memory structure according to claim 1, wherein an upper surface of the storage well is provided with an implantation layer.

4. The 1.5T SONOS memory structure according to claim 3, wherein upper surfaces of the P-type well and the implantation layer are provided with an oxide layer.

5. The 1.5T SONOS memory structure according to claim 4, wherein the ONO stack layer is further provided between a bottom surface of the storage transistor gate and the oxide layer.

6. The 1.5T SONOS memory structure according to claim 4, wherein a third sidewall is provided on polysilicon between a lower end of the sidewall of the storage transistor gate and the oxide layer.

7. A method for manufacturing the 1.5T SONOS memory structure according to claim 1, wherein the method comprises:
   step 1: providing the P-type well and the storage well on the one side of the P-type well, depositing a polysilicon layer on the P-type well and the storage well, depositing silicon nitride on the polysilicon layer, and then performing photoetching and etching to form the select transistor gate on the P-type well and covered with a silicon nitride layer on the top;
   step 2: depositing the ONO stack layer on the P-type well, the select transistor gate, and the storage well;
   step 3: depositing polysilicon on the ONO stack layer, performing etching until the silicon nitride layer on the top of the select transistor gate is exposed, and forming the storage transistor gate on the storage well, the sidewall of the storage transistor gate farthest from the select transistor gate being the slope;
   step 4: performing photoetching to open adjacent storage units on the P-type well on the side of the select transistor gate farthest from the storage transistor gate, removing polysilicon on the adjacent storage units and a silicon oxide and silicon nitride layer on an outer layer of the ONO stack layer, and reserving a layer of silicon oxide on the sidewall of the select transistor gate and the adjacent storage units;
   step 5: removing the silicon nitride layer on the top of the select transistor gate, the height of the select transistor gate being less than the height of the storage transistor gate;
   step 6: sequentially performing deposition and etching to form the first sidewall relying on the ONO stack layer on the top of the select transistor gate and to form the second sidewall on the sidewall of the select transistor gate farthest from the storage transistor gate; and
   step 7: forming the second metal silicide on the remaining part of the top of the select transistor gate and the first metal silicide on the sidewall of the storage transistor gate.

8. The method for manufacturing the 1.5T SONOS memory structure according to claim 7, wherein in step 1, a thickness of the silicon nitride layer on the top of the select transistor gate formed after photoetching and etching is 500-600 angstroms.

9. The method for manufacturing the 1.5T SONOS memory structure according to claim 7, wherein in step 5, the silicon nitride layer on the top of the select transistor gate is removed through acid pickling.

10. The method for manufacturing the 1.5T SONOS memory structure according to claim 7, wherein in step 1, the P-type well and the storage well on the one side of the P-type well are located on a Deep N-type Well (DNW).

11. The method for manufacturing the 1.5T SONOS memory structure according to claim 10, wherein in step 1, an oxide layer is provided above the DNW and below the P-type well and the storage well.

12. The method for manufacturing the 1.5T SONOS memory structure according to claim 11, wherein in step 1, an implantation layer on the DNW is provided below the oxide layer on the storage well.

13. The method for manufacturing the 1.5T SONOS memory structure according to claim 12, wherein in step 6, deposition and etching are sequentially performed to form a third sidewall on the polysilicon between a lower end of the sidewall of the storage transistor gate and the oxide layer.

14. The method for manufacturing the 1.5T SONOS memory structure according to claim 13, wherein the first sidewall, the second sidewall, and the third sidewall are silicon nitride.

15. The method for manufacturing the 1.5T SONOS memory structure according to claim 7, wherein in step 7, the second metal silicide is formed on the remaining part of the top of the select transistor gate and the first metal silicide is formed on the sidewall of the storage transistor gate by adopting a self-alignment process.

* * * * *